United States Patent [19]
Kim

[11] Patent Number: 5,363,216
[45] Date of Patent: Nov. 8, 1994

[54] CONTACT IMAGE SENSOR MODULE

[75] Inventor: Chung J. Kim, Seoul, Rep. of Korea

[73] Assignee: Goldstar Co., Ltd., Seoul, Rep. of Korea

[21] Appl. No.: 996,016

[22] Filed: Dec. 23, 1992

[30] Foreign Application Priority Data

Dec. 26, 1991 [KR] Rep. of Korea .............. 24473/1991

[51] Int. Cl.$^5$ ............................................. H04N 1/04
[52] U.S. Cl. .................................. 358/482; 358/471;
250/208.1; 257/292
[58] Field of Search ............... 358/482, 483, 474, 471,
358/213.11, 213.23; 250/208.1; 257/461, 292,
291, 443, 444

[56] References Cited
U.S. PATENT DOCUMENTS

| | | | |
|---|---|---|---|
| 4,453,187 | 6/1984 | Komiya et al. ................ | 358/213.31 |
| 5,070,236 | 12/1991 | Miyake ............................ | 250/208.1 |
| 5,160,836 | 11/1992 | Miyake ............................ | 250/208.1 |
| 5,196,721 | 3/1993 | Miyake et al. ................... | 257/292 |
| 5,198,905 | 3/1993 | Miyake ............................ | 358/213.31 |

Primary Examiner—Edward L. Coles, Sr.
Assistant Examiner—Fan Lee
Attorney, Agent, or Firm—John P. White

[57] ABSTRACT

A contact image sensor module comprising a plurality of blocks for transforming light being incident upon into image data, the block having a plurality of unit cells, the unit cell including a light-electro transducer and a switching element, a plurality of common lines for providing a driving voltage for the light-electro transducers having a first predetermined value and a driving voltage for the switching elements having a second predetermined value, each common line of the plurality of common lines is connected to a gate (driving part) of a corresponding unit cell and a light-electro transducer of a preceding unit cell in every block, a driving circuit for providing, in consecutive order, to each common line the driving voltage for the switching element for a predetermined time period while providing the driving voltage for the light-electro transducer to the plurality of common lines except the common line being provided with the voltage for the switching element, whereby switching elements of corresponding unit cells in each block are actuated, a plurality of data lines for transmitting the image data, each data line of the plurality of data lines is connected to all switching elements of corresponding block, and a reading-out circuit for receiving the image data via the plurality of data lines to read out.

4 Claims, 8 Drawing Sheets

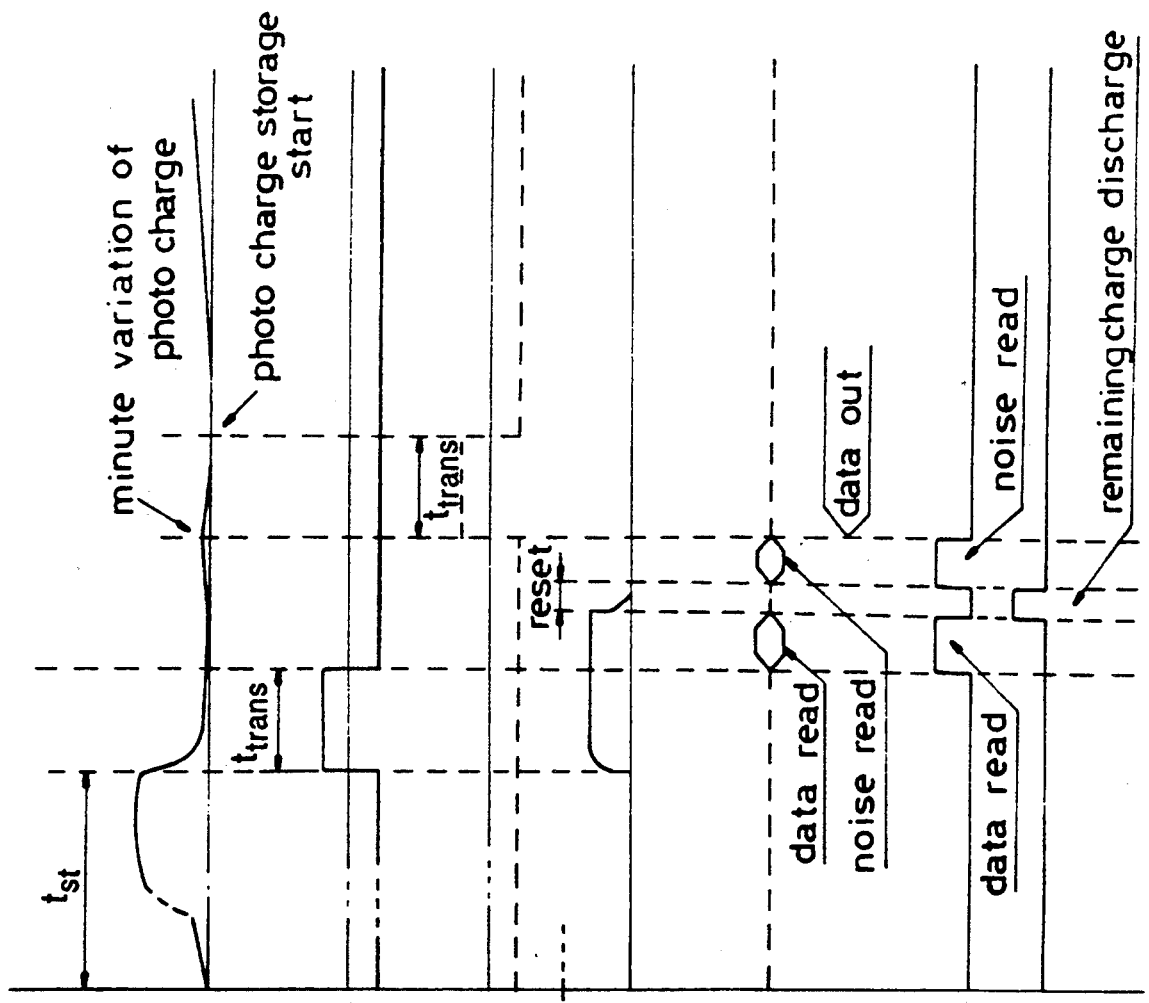

CONTACT IMAGE SENSOR MODULE

BACKGROUND OF THE INVENTION

1. Field of the Invention

The present invention relates in general to contact image sensor modules in facsimiles or personal computers for reading characters and pictures on documents, and more particularly to a contact image sensor module of high quality which is capable of perfectly removing a cross-over between metal lines which is unavoidable in a matrix circuit wiring manner.

2. Description of the Prior Art

Generally, a contact image sensor is a device which is used to sense a character or a picture on a document in transmission and reception of the document content in a facsimile. The performance of the contact image sensor is dependent on the signal process time an accurate signal with no noise therefrom can be outputted.

A linear contact image sensor of the matrix circuit wiring manner is comprised of thin film devices which have recently developed concentratedly to act up to an information age. With the linear contact image sensor of the matrix circuit wiring manner, data can be read out by only one read-out IC and the production of a compact system is enabled, resulting in reduction in the manufacturing cost of the sensor and increase in the yield thereof.

Referring to FIG. 1, there is shown a circuit diagram of a conventional linear contact image sensor of a parallel read-out manner which has conventionally been employed most frequently. The reference numeral UC designates a unit cell which is comprised of a photodiode PD as optical sensing means for receiving light being incident upon from a document to produce a photocharge and a thin film transistor (TFT) TR as switching means for passing the photocharge produced from the photodiode PD. The reference numeral Ci in the unit cell UC designates an internal capacitance in the photodiode PD which is shown in the form of an equivalent circuit.

As shown in FIG. 1, the linear contact image sensor of the parallel read-out manner comprises a plurality of blocks BL1–BLn which are arranged successively and linearly. Each of the blocks BL1–BLn has m unit cells UC1–UCm. Each of a plurality of gate address lines GAL1–GALn is connected in common to gate terminals of m TFTs TR1–TRm in the m unit cells UC1–UCm in a corresponding one of the plurality of blocks BL1–BLn to apply a bias from a driving circuit DC to the corresponding block. Each of a plurality of data lines DL1–DLm is connected to a drain terminal of a corresponding one of the TFTs TR1–TRm in the m unit cells UC1–UCm in every the block to transmit data simultaneously outputted from the corresponding block to a reading-out circuit RC.

In operation, the photodiodes PD of the plurality of unit cells UC1,1–UCn,m in the plurality of blocks BL1–BLn receive the light being incident upon from the document and produce the resultant photocharges. At this time, the gate bias from the driving circuit DC is applied to a corresponding one of the plurality of blocks BL1–BLn via a corresponding one of the plurality of gate address lines GAL1–GALn. For example, provided that the gate bias from the driving circuit DC is applied to the ith block BLi, the m unit cells UCi,1–UCi,m in the ith block BLi are simultaneously addressed. As a result, m data are outputted in parallel from the ith block BLi. The m data from the ith block BLi are transmitted through the m data lines DL1–DLm to the reading-out circuit RC, which then processes the data transmitted through the data lines DL1–DLm.

In FIG. 1, a photodiode reverse bias $V_{PD}$ is shown to be applied simultaneously to the n blocks BL1–BLn through a single photodiode reverse bias application line PBL. Since the photodiodes PD1,1–PDn,m of the plurality of unit cells UC1,1–UCn,m in the plurality of blocks BL1–BLn all are applied with the reverse bias $V_{PD}$, the photodiodes PD1,1–PDn,m produce the photocharges according to the intensity of the light being incident upon from the document and output pure photocurrent resulting from the produced photocharges.

However, the conventional linear contact image sensor of the parallel read-out manner has a disadvantage, in that cross-overs (portions a in FIG. 1) between the adjacent data lines DL are formed, resulting in formation of parasitic capacitances. The parasitic capacitances causes crosstalks and leaks between the data lines resulting in generation of a distortion and a noise in the data signal. As a result, the data become inaccurate. Also, cross-overs (portions b in FIG. 1) between the adjacent gate address and data lines GAL and DL are formed, resulting in formation of parasitic capacitances. The parasitic capacitances absorb a portion of the date signal charges being transmitted through the data lines to the reading-out circuit, thereby causing the output data to become inaccurate. Furthermore, in order to discharge the absorbed charges and then transmit the discharged charges to the reading-out circuit RC, there may be required a constant charge transfer time after the turning-off of the gate bias. This results in an unnecessary increase in the data read-out time.

Referring to FIG. 2, there is shown a circuit diagram of a conventional linear contact image sensor of a selective read-out manner. The linear contact image sensor of the selective read-out manner in FIG. 2 is a sensor for an improvement in the linear contact image sensor of the parallel read-out manner. Herein, a unit cell UC is comprised of a light sensing photodiode PD and a switching thin film transistor (TFT) TR.

As shown in FIG. 2, the linear contact image sensor of the selective read-out manner comprises a plurality of blocks BL1–BLm which are arranged successively and linearly. Each of the blocks BL1–BLm has n unit cells UC1–UCn. The linear contact image sensor of the selective read-out manner also comprises n gate address lines GAL1–GALn corresponding to the n unit cells UC1–UCn in every the block and m data lines DL1–DLm corresponding to the blocks BL1–BLm.

Namely, each of the n gate address lines GAL1–GALn is connected to a gate terminal of a corresponding one of the TFTs TR1–TRn in the n unit cells UC1–UCn in every the block and each of the data lines DL1–DLm is connected in common to drain terminals of the n TFTs TR1–TRn in the n unit cells UC1–UCn in a corresponding one of the plurality of blocks BL1–BLm.

In operation, the photodiodes PD1,1–PDm,n of the plurality of unit cells UC1,1–UCm,n in the plurality of blocks BLt–BLm receive the light being incident upon from the document and produce the resultant photocharges. At this time, the driving circuit DC selects one of the plurality of gate address lines GAL1–GALn, thereby to turn on a corresponding one of the TFTs TR1-TRn in the n unit cells UC1-UCn in every the block. As a result, data is outputted from the unit cell in every the block corresponding to the selected gate address line. Namely, one data is selectively outputted in the unit of the block and the data selectively outputted from the blocks are applied through the corresponding data lines DL1-DLm, respectively, to the reading-out Circuit RC.

In FIG. 2, similarly to that shown in FIG. 1, a photodiode reverse bias $V_{PD}$ is shown to be applied simultaneously to the photodiodes PD1,1-PDm,n of the plurality of unit cells UC1,1-UCm,n in the m blocks BL1-BLm through a single photodiode reverse bias application line PBL.

In the linear contact image sensor of FIG. 2, for example, the data are outputted from the ith unit cells UC1,i-UCn,i in the blocks BL1-BLm corresponding to the selected gate address line GAL1 and the output data are transmitted through the corresponding data lines, respectively. As a result, the cross-overs a between the adjacent data lines DL as shown in FIG. 1 are not formed, resulting in no formation of parasitic capacitances.

However, in the linear contact image sensor of FIG. 2, similarly to that in FIG. 1, there are still present the parasitic capacitances due to the cross-overs (portions c in FIG. 2) between the adjacent data and gate address lines DL and GAL. This results in generation of a noise in the data signal and, thus, an unnecessary increase in the data read-out time.

On the other hand, in the linear contact image sensor of FIG. 2, differently from that in FIG. 1, there may be formed parasitic capacitances due to cross-overs (portions d in FIG. 2) between the adjacent gate address lines GAL. These parasitic capacitances are of no direct relevance to the data lines DL and thus have no effect on the data signal so far as a short fail is not generated.

Referring to FIG. 3, there is shown a circuit diagram of a conventional linear contact image sensor of a meander line manner. As shown in this figure, each of m unit cells UC1-UCm is comprised of a photodiode PD and a thin film transistor (TFT) TR. Gate terminals of the TFTs TR1-TRm in the m unit cells UC1-UCm are connected in common to a gate address line GAL, which is connected in the unit of block. As a result, the total 38 address lines GAL1-GAL38 are provided to simultaneously address the m unit cells UC1-UCm in the unit of block BL. One of the m unit cells UC1-UC38,m in the 38 blocks BL1-BL38 is selected in the unit of block and drain terminals of the TFTs TR of the 38 unit cells UC thus selected are connected in common, thereby to form a data line DL.

It the linear contact image sensor of the meander line manner in FIG. 3, the drain terminals of the TFTs in the unit cells arranged at the same position in the unit of two blocks are connected to each other, thereby to form a data line of the meander structure. For example, the data lines of the meander structure may be formed as follows: the first data line DL1 is formed by connecting, in consecutive order, the drain terminal of the TFT TR1,1 of the first unit cell UC1,1 in the first block BL1, the drain terminal of the TFT TR2,m of the mth unit cell UC2,m in the second block BL2, . . . , the drain terminal of the TFT TR37,1 of the first unit cell UC37,1 in the 37th block BL1 and the drain terminal of the TFT TR38,m of the mth unit cell UC38,m in the 38th block BL38.

On the other hand, m data lines DL-DLm are connected to the drain terminals of the TFTs TR1,1-TR38,m of the m unit cells UC1,1-UC38,m in the 38 blocks BL1-BL38, respectively. For example, in the first block BL1, the first unit cell UC1,1 is connected to the first data line DL1, the second unit cell UC1,2 is connected to the second data line DL2, . . . , the m-1th unit cell UC1,m-1 is connected to the m-1th data line DLm-1 and the mth unit cell UC1,m is connected to the mth data line DLm. In the second block BL2, in the reverse order to the first block BL1, the first unit cell UC2,1 is connected to the mth data line DLm, the second unit cell UC2,2 is connected to the m-1 th data line DLm-1 , . . . , the m-1th unit cell UC2, m-1 is connected to the second data line DL2 and the mth unit cell UC2, m is connected to the first data line DL1.

In other words, in the odd blocks BL1 , BL3 . . . , and BL37, the data lines DL1-DLm are in sequence connected to the unit cells UC1-UCm, respectively, and, in the even blocks BL2, BL4, . . . , and BL38, the data lines DL1-DLm are connected to the unit cells UC1-UCm, in the reverse order. For this reason, first and second reading-out circuits RC1 and RC2 are connected, respectively, to the data lines DL1-DL38 of the odd and even blocks BL1, BL3, . . . , and BL37 and BL2, BL4 . . . , and BL38, in order to read-out the data therefrom, respectively. In result, the data from the odd blocks BL1, BL3, . . . , and BL37 are read out by the first reading-out circuit RC1 and the data from the even blocks BL2, BL4, . . . , and BL38 are read out by the second reading-out circuit RC2. This enables the process of accurate data.

However, the linear contact image sensor of the meander line manner in FIG. 3 is desirable in that there can be prevented the generation of the parasitic capacitances due to the cross-overs between the adjacent data lines DL, but has a disadvantage, in that there are still present the parasitic capacitances due to the cross-overs (portions e in FIG. 3) between the adjacent data and gate address lines DL and GAL. This results in generation of a noise in the data signal and, thus, an unnecessary increase in the data read-out time. There are also present parasitic capacitances due to crossovers (portions f in FIG. 3) between the adjacent data and photodiode reverse bias application lines DL and PBL. These parasitic capacitances absorb a portion of the data signal charges being transmitted through the data lines to the reading-out circuits, resulting in an inaccuracy in the output data and generation of a noise therein.

On the other hand, there may be present parasitic capacitances due to cross-overs (portions g in FIG. 3, between the adjacent gate address and photodiode reverse bias application lines GAL and PBL. These parasitic capacitances are of no direct relevance to the data lines DL, similarly to those due to the cross-overs between the adjacent gate address lines GAL, and thus have no effect on the data signal so far as a short fail is not generated.

The linear contact image sensor of the meander line manner has a particular disadvantage, in that the photodiodes arranged at a constant pitch on a semi-conductor substrate are reduced in size since the data lines DL1-DL38 are passed between the unit cells. This results in a reduction in a light receiving area corresponding to an effective area of the image sensor. For this reason, the meander line manner not only degrades the quality of the image sensor, but it is not applicable to a high resolution image sensor.

SUMMARY OF THE INVENTION

Therefore, the present invention has been made in view of the above problems, and it is an object of the present invention to provide a contact image sensor module of high quality which is capable of perfectly removing cross-overs between data metal lines and between the data metal lines and other metal lines which are unavoidable in a matrix circuit wiring manner.

In accordance with the present invention, the above and other objects can be accomplished by a provision of a contact image sensor module comprising: a plurality of blocks for transforming light being incident upon into image data, said block having a plurality of unit cells, said unit cell including an light-electro transducer and a switching element; a plurality of common lines for providing a driving voltage for said light-electro transducers having a first predetermined value and a driving voltage for said switching elements having a second predetermined value, each common line of said plurality of common lines is connected to a gate (driving part) of a corresponding unit cell and a light-electro transducer of a preceding unit cell in every said block; a driving circuit for providing, in consecutive order, to each common line of said driving voltage for said switching element for a predetermined time while providing said driving voltage for said light-electro transducer to said plurality of common lines except a common line being provided with said voltage for said switching element, whereby switching elements of corresponding unit cells in each block are actuated; a plurality of data lines for transmitting said image data, each data line of said plurality of data lines is connected to all switching elements of corresponding block; and means for receiving said image data via said plurality of data lines to read out.

BRIEF DESCRIPTION OF THE DRAWINGS

The above and other objects, features and advantages of the present invention will be more clearly understood from the following detailed description taken in conjunction with the accompanying drawings, in which:

FIGS. 8A to 8G are timing charts of a signal from the ith unit cell in every the block in the sensor of FIG. 4.

DETAILED DESCRIPTION OF THE INVENTION

Figure 1:
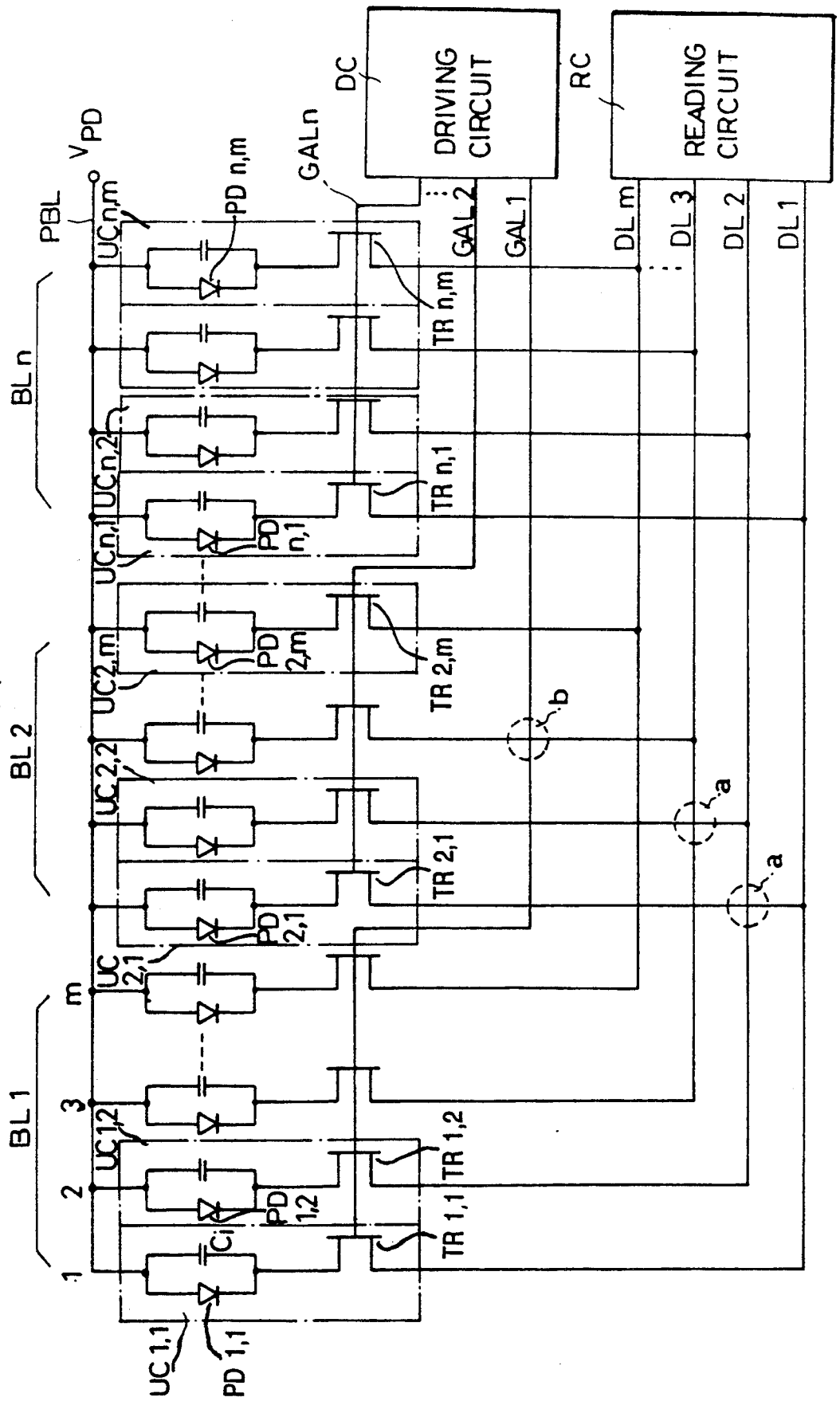
FIG. 1 is a circuit diagram of a conventional linear contact image sensor of a parallel read-out manner.
Figure 2:
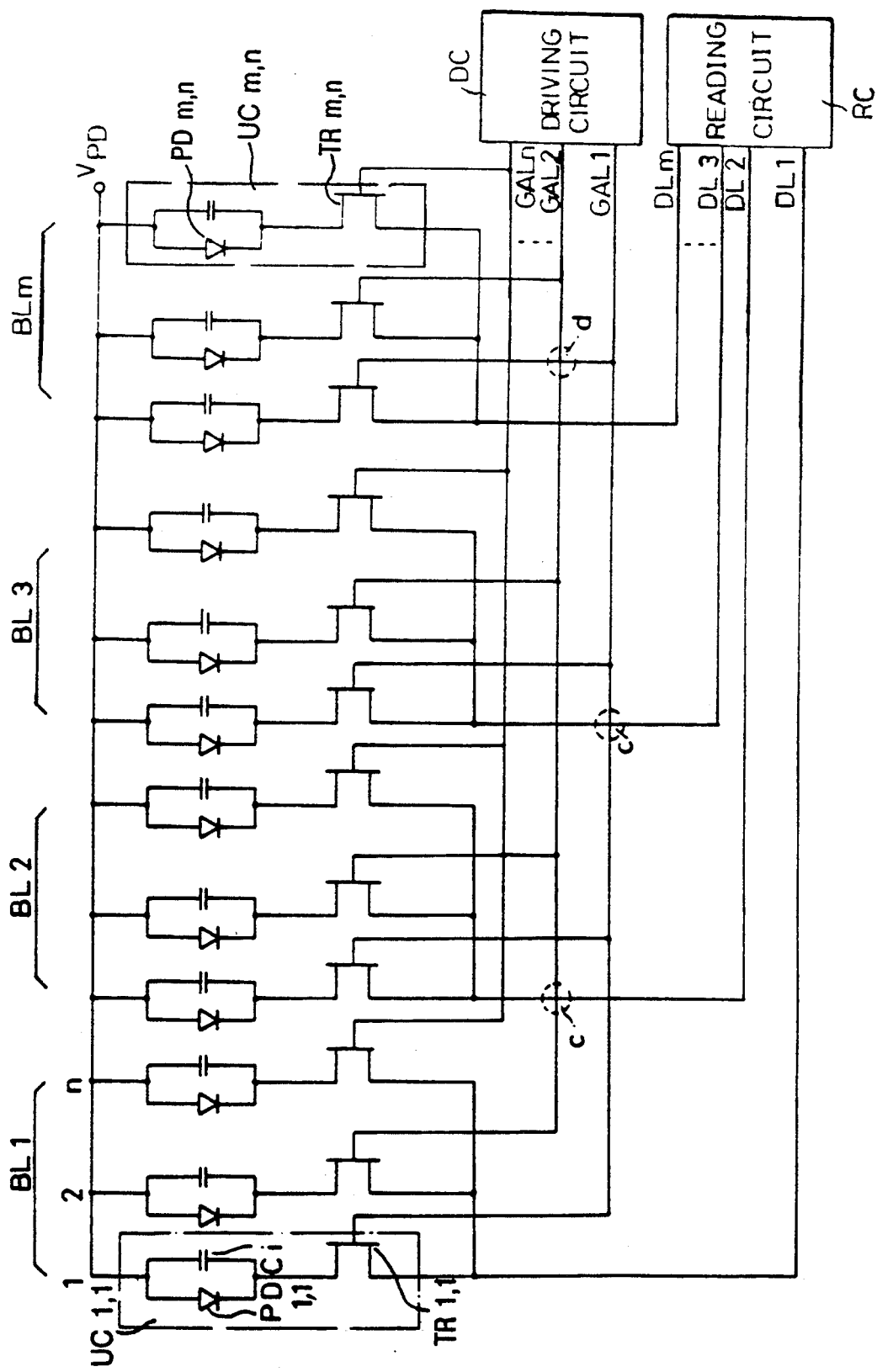
FIG. 2 is a circuit diagram of a conventional linear contact image sensor of a selective read-out manner.
Figure 3:
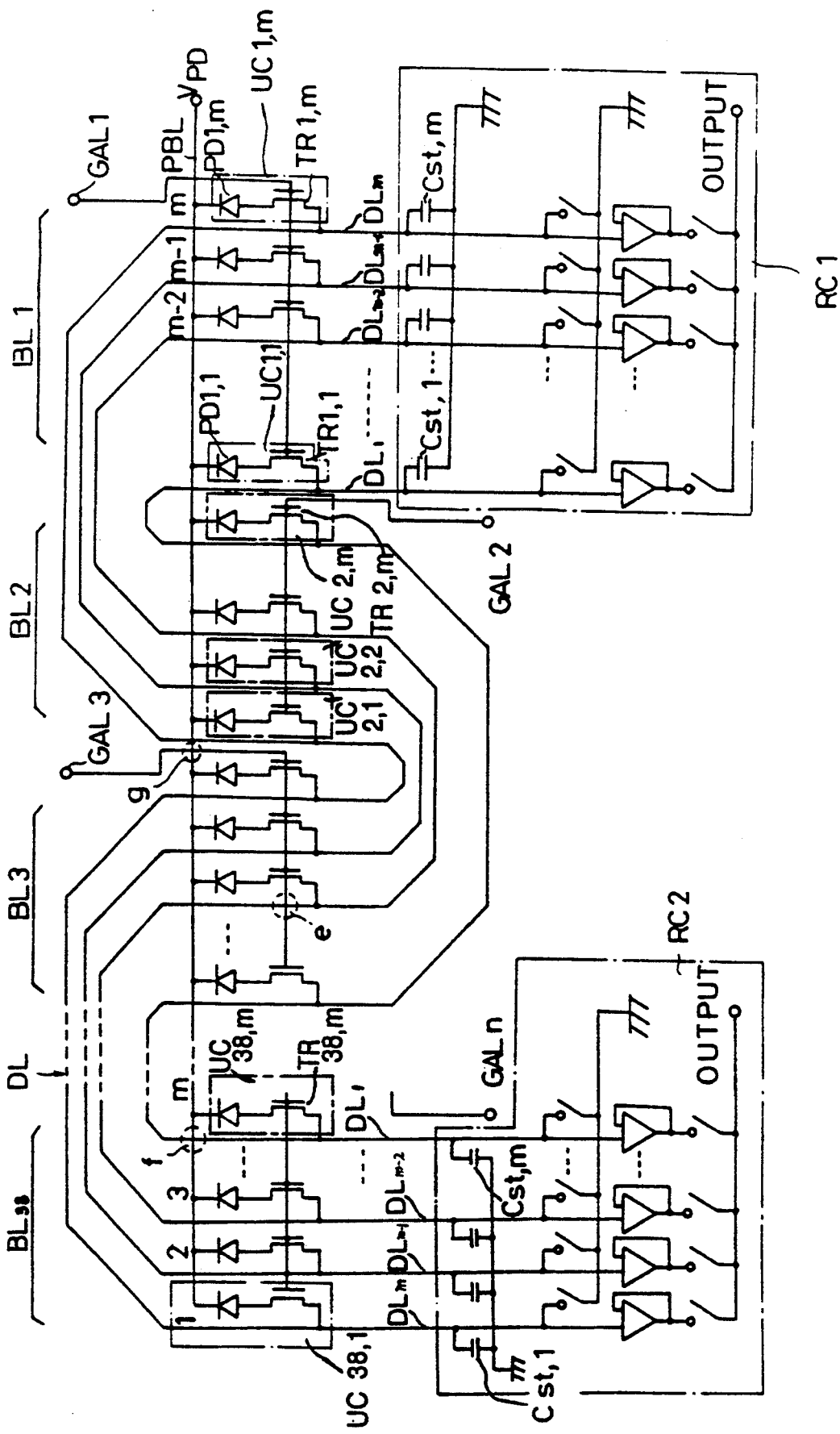
FIG. 3 is a circuit diagram of a conventional linear contact image sensor of a meander line manner.
Figure 4:
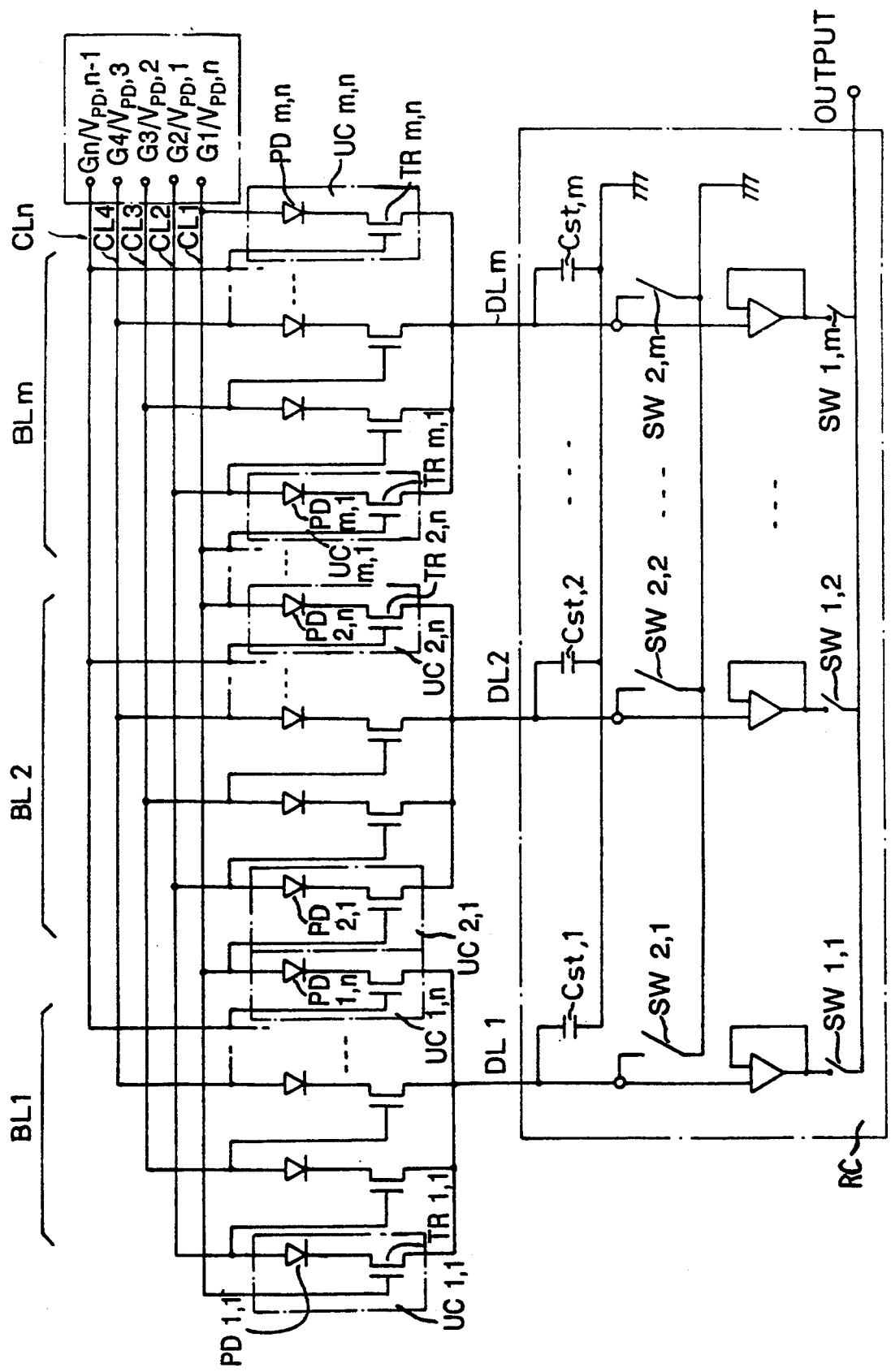
FIG. 4 is a circuit diagram of a linear contact image sensor of a non-crossing metal line manner in accordance with the present invention.

Referring to FIG. 4, there is shown a circuit diagram of a linear contact image sensor of a non-crossing metal line manner in accordance with the present invention. The linear contact image sensor module of the non-crossing metal line manner of the present invention comprises m blocks for recognizing a document image. Each of the m blocks has n unit cells, each including a switching element and a light-electro transducer coupled to the switching element. The linear contact image sensor of the present invention also comprises n common lines CL1–CLn corresponding to the unit cells in every the block. Each of the common lines CL1–CLn is connected to a gate of the switching element of a corresponding one of the unit cells and an anode of the light-electro transducer of a preceding one of the unit cells in every the block. For example, the ith common line CLi is connected to the gate of the switching element of the ith unit cell UCx,i (where, x is a random number) and the anode of the light-electro transducer of the i-ith unit cell UCx,i-1 in every the block. Namely, the common line CL1 is connected to the gate of the switching element of the first unit cell UCx,1 and the anode of the light-electro transducer of the nth unit cell UCx,n in every the block.

The linear contact image sensor of the present invention also comprises a driving circuit for applying reverse bias voltages and, in sequence, switching element driving voltages G1–Gn to the unit cells in every the block via the common lines CL1–CLn.

The linear contact image sensor of the present invention also comprises a plurality of data lines, each connected to all the switching elements of a corresponding one of the blocks and a reading-circuit connected to the data lines.

The operation of the linear contact image sensor with the above-mentioned construction in accordance with the present invention will hereinafter be described in detail.

Terminals $G1/V_{PD},n$–$Gn/V_{PD},n-1$ of the driving circuit are connected, respectively, to the common lines CL1-CLn, each of which connected to the gate of the switching element of a corresponding one of the unit cells and the anode of the light-electro transducer of a preceding one of the unit cells in every the block.

Initially, the reverse bias voltages are generated from all the terminals $G1/V_{PD},n$–$Gn/V_{PD},n-1$ of the driving circuit. At this time, the light-electro transducers of the unit cells in every the block store thereon photocharges corresponding to the light being incident upon. Under this condition, upon application of the switching element driving voltage of desired value from the terminal $G1/V_{PD},n$ of the driving circuit to the corresponding common line CL1, the switching element TRx,1 of the corresponding unit cell in every the block is turned on. As a result, the photocharge stored on the light-electro transducer PDx,1 in the corresponding unit cell is transmitted via the switching element TRx,1 to a corresponding one of the data lines DL1–DLn. At this time, the light-electro transducer of a preceding one of the unit cells in every the block is maintained at its OFF state during application of the switching element driving voltage G1 from the terminal $G1/V_{PD},n$ of the driving circuit.

In this manner, thereafter, the switching element driving voltages G2–Gn are in sequence applied to the corresponding common lines CL2–CLn, thereby to transmit the image data to the reading-circuit.

Herein, subscripts in the reference numerals $V_{PD},1$–$V_{PD},n$ designating the reverse bias voltages do not indicate a difference among the reverse bias voltages, but distinguish the unit cells in every the block from one another. This is similarly applied to the reference numerals G1–Gn designating the switching element driving voltages.

FIGS. 8A to 8G are timing charts illustrating an operation of the ith unit cell UCx,i (where, x=1-m) in every the block in the sensor of FIG. 4. The light-electro transducer PDx,i of the ith unit cell UCx,i stores thereon a photocharge corresponding to the light being incident upon, during application of the reverse bias voltage. In FIG. 8A, $t_{st}$ is the time during which the photocharge is stored on the light-electro transducer PDx,i. At this time, upon generation of the switching element driving voltage from the terminal Gi/V$_{PD}$, i-1 of the driving circuit, the driving voltage Gi is applied through the corresponding common line CLi to the gate of the switching element TRi of the ith unit cell UCx,i in every the block. As a result, the switching element TRi is driven during the time the driving voltage G1 is applied, as shown in FIG. 8B.

As the switching element TRi is driven, the photocharge stored on the light-electro transducer PDx,i is transferred to a capacitor Cst in the reading-out circuit, as shown in FIG. 8D. Herein, $t_{trans}$ is the time during which the switching element TRi is driven, i.e., the photocharge on the light-electro transducer PDx,i is transferred to the capacitor Cst in the reading-out circuit.

Then, a switch SW1,x in the reading-out circuit is turned on, thereby causing the charge stored on the capacitor Cst or the image data to be read out, as shown in FIGS. 8E and 8F. With the switch SW1,x turned off and a switch SW2,x turned on, the remaining charge is discharged, as shown in FIG. 8G. It is noted herein that a noise may be contained in the data previously read-out. For this reason, there is a necessity for reading-out the noise data separately and subtracting the read-out noise data from the previously read-out data, so as to obtain pure image data. Therefore, with the switch SW2,x turned off and the switch SW1,x turned on again, the noise data is read out.

Thereafter, the switching element driving voltage Gi+1 is applied to the switching element TRx,i+1 of the i+1th unit cell in every the block for the time $t_{trans}$. At this time, the switching element driving voltage Gi+1 causes a minute variation in the photocharge being stored on the light-electro transducer PDx,i of the ith unit cell UCx,i in every the block after the discharging of the previously stored charge. Then, upon application of the reverse bias voltage to the common line CLi+1, the light-electro transducer PDx,i begins to store the photocharge corresponding to the light being incident upon, as shown in FIGS. 8A and 8C.

Noticeably, the charge transfer time $t_{trans}$ is an ignorable short time as compared with the time $t_{st}$ during which the photocharge is stored on the photodiode PD. The photocharge minute variation is generated just after the read-out of the data from the ith unit cell. Amount of the photocharge being stored on the photodiode PD is not dependent on the charge storage time $t_{st}$, but is dependent on the wavelength and intensity of the light being incident upon the photodiode PD. Therefore, the photocharge minute variation has no effect on the data of the group i.

Figure 5:
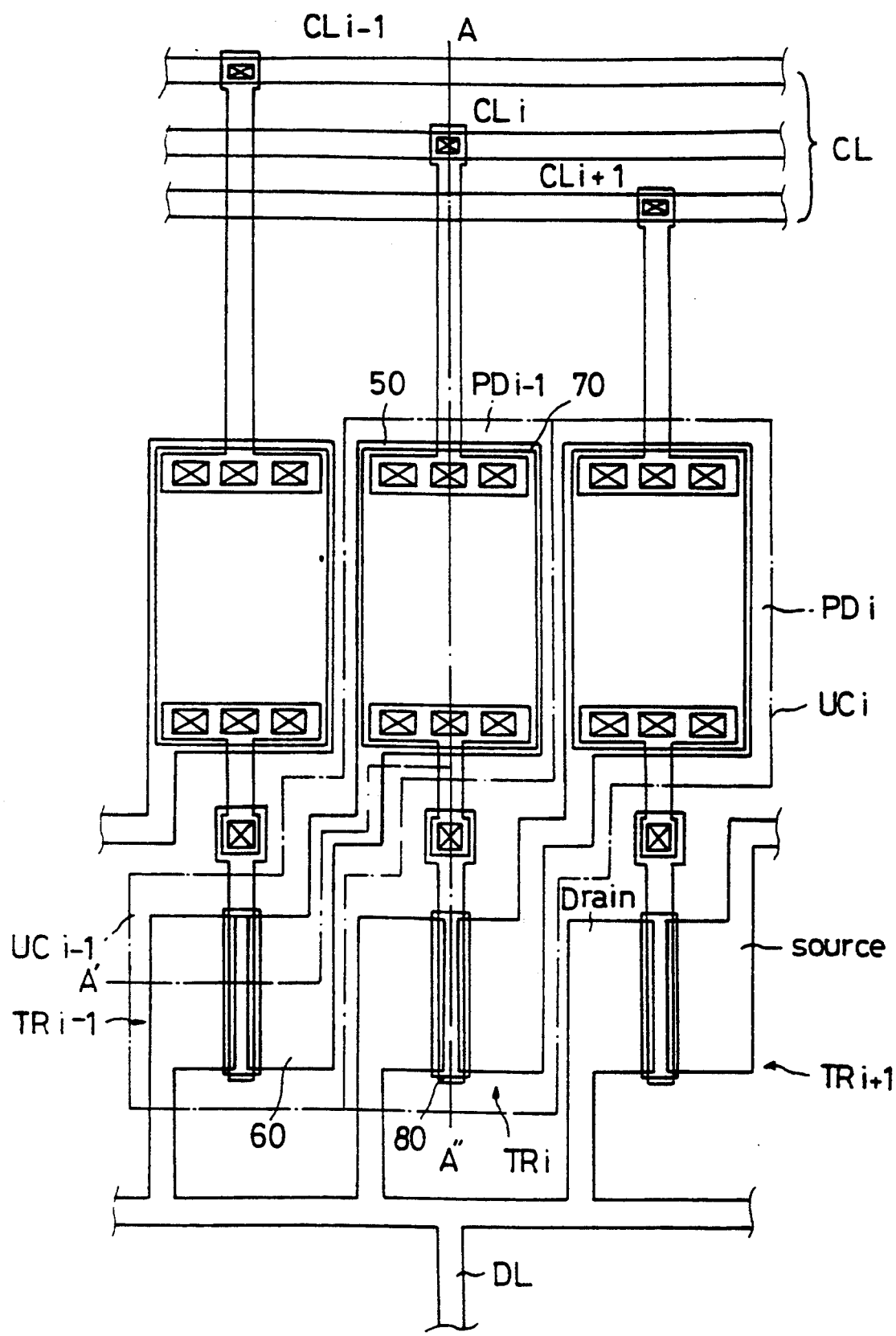
FIG. 5 is a layout diagram of unit cells in a block in the sensor of FIG. 4.

Referring to FIG. 5, there is shown a layout diagram of the unit cells in a random block in the sensor of FIG. 4. As mentioned above with reference to FIG. 4, the ith common line CLi is connected to the gate of the ith switching element (TFT) and the i-ith light-electro transducer (photodiode). As a result, in FIG. 5, provided that the central common line is the ith common line CLi, the central photodiode connected to the central common line is the i-ith photodiode PDi-1. In this connection, a source 60 of the i-ith switching element (TFT) TRi-1 is connected to a lower metal electrode 50 of the i-1th photodiode PDi-1 and a gate 80 of the ith switching element (TFT) TRi is connected to the ith common line CLi via an upper ITO transparent electrode 70 of the ith photodiode PDi.

Figure 6:
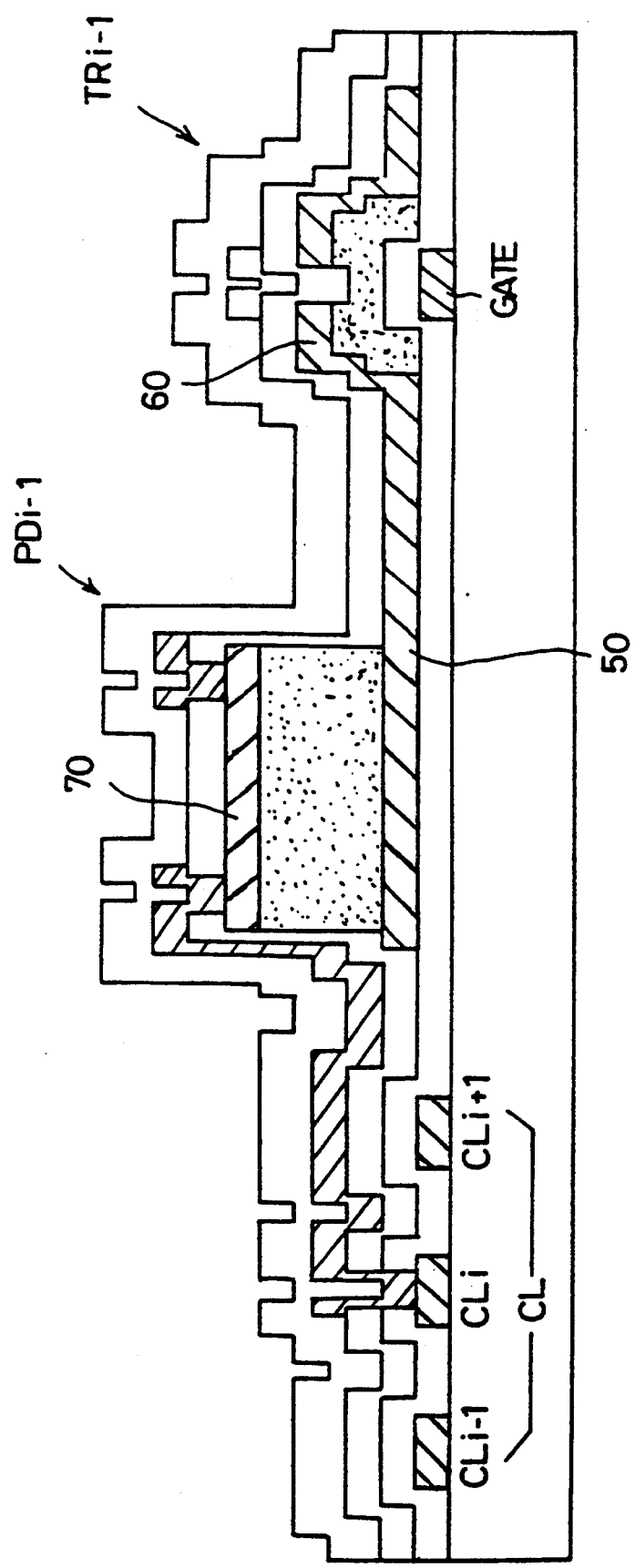
FIG. 6 is a sectional view, taken on the line A–A' of FIG. 5.

FIG. 6 is a sectional view, taken on the line A–A' of FIG. 5. In this drawing, there are shown the connection of the source electrode 60 of the i-1th switching element (TFT) TRi-1 and the lower metal electrode 50 of the i-1th photodiode PDi-1 and the connection of the common line CLi and the upper ITO transparent electrode 70 of the i-1th photodiode PDi-1.

Figure 7:
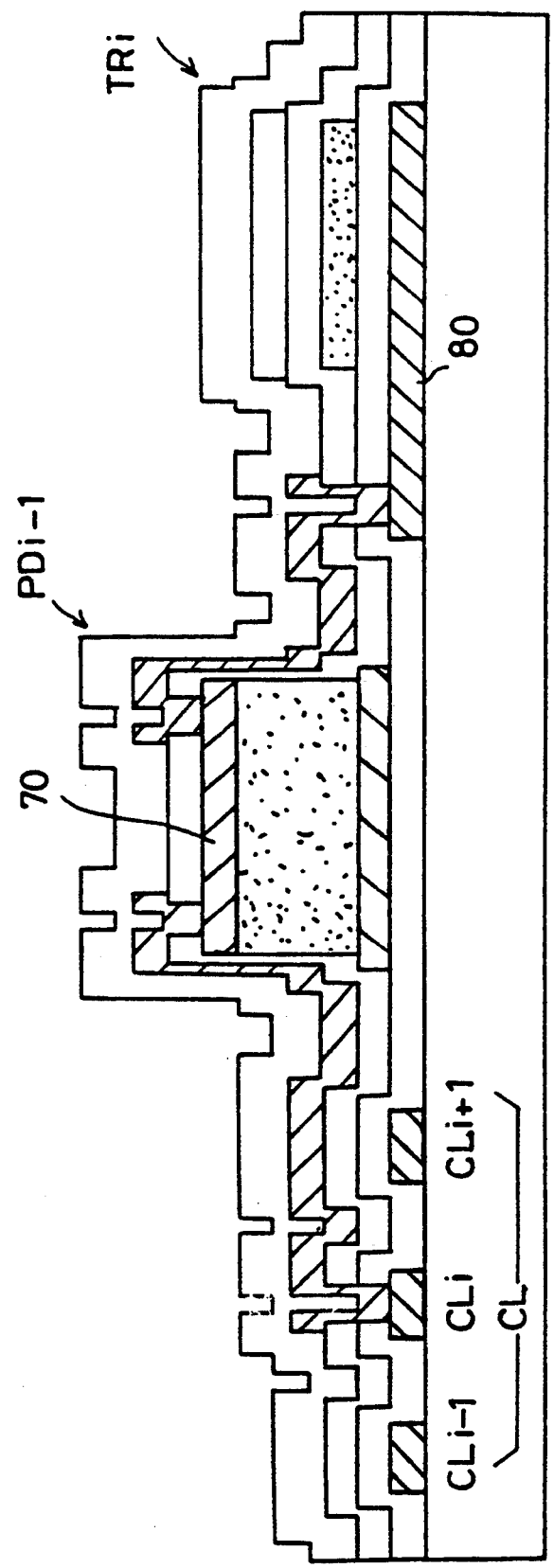
FIG. 7 is a sectional view, taken on the line A–A" of FIG. 5.

FIG. 7 is a sectional view, taken on the line A–A" of FIG. 5. In this drawing, there are shown the connection of the gate electrode 80 of the ith TFT TRi of the ith unit cell UCi and the upper ITO transparent electrode 70 of the i-ith photodiode PDi-1 of the preceding unit cell UCi-1 and the connection of the common line CLi and the upper ITO transparent electrode 70 of the i-ith photodiode PDi-1.

As hereinbefore described, according to the present invention, there can perfectly be removed the cross-overs between the data metal lines and between the data metal lines and other metal lines which are unavoidable in the matrix circuit wiring manner. Therefore, there can be prevented generation of the noise due to the parasitic capacitances resulting from the cross-overs and the unnecessary data readout time can thus be reduced. As a result, it is possible to obtain the contact image sensor of high quality.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A contact image sensor module comprising:
   a plurality of unit cells for transforming light being incident upon into image data, said unit cells being divided into m blocks, each of said blocks consisting of n unit cells, each of said unit cells including a light-electro transducer and a switching element;
   n common lines for providing a driving voltage for said light-electro transducers and a driving voltage for said switching elements, each of said common lines is connected to a gate electrode of said switching element in a corresponding one of said unit cells in each of said blocks via an anode electrode of said light-electro transducer in a preceding one of said unit cells;
   a driving circuit connected to each of said common lines, for generating for each of said common lines said driving voltage for said switching element of said corresponding one of said unit cells and said driving voltage for said light-electro transducer of said preceding one of said unit cells in consecutive order, said driving voltage for said light-electro transducer of said preceding one of said unit cells is the same as a voltage of said switching element of said corresponding one of said unit cells for an off state;

m data lines, each of said data lines is connected to a drain electrode of every said switching element in a corresponding one of said m blocks; and means for receiving said image data via said m data lines to read out.

2. A contact image sensor module as set forth in claim 1, wherein said light-electro transducer is a photodiode.

3. A contact image sensor module as set forth in claim 1, wherein said switching element is a thin film transistor.

4. A contact image sensor module as set forth in claim 1, wherein said anode electrode of said light-electro transducer is an upper ITO electrode.

* * * * *